United States Patent
Forbes (10) Patent No.: US 6,288,575 B1
(45) Date of Patent: Sep. 11, 2001

(54) PSEUDO-DIFFERENTIAL CURRENT SENSE AMPLIFIER WITH HYSTERESIS

(75) Inventor: Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/379,532

(22) Filed: Aug. 24, 1999

(51) Int. Cl.[7] .................... H03K 5/153; G01R 19/165
(52) U.S. Cl. ..................... 327/57; 327/205; 327/551; 365/208
(58) Field of Search .................. 327/52, 53, 54, 327/57, 205, 551; 365/207, 208

(56) References Cited

U.S. PATENT DOCUMENTS

| | | | |
|---|---|---|---|
| 4,503,340 | 3/1985 | Linder | 327/72 |
| 4,616,148 | 10/1986 | Ochii et al. | 327/55 |
| 5,132,576 | * 7/1992 | Park | 327/537 |
| 5,309,047 | 5/1994 | Tiede et al. | 327/52 |
| 5,359,727 | 10/1994 | Kurita et al. | 713/400 |
| 5,371,421 | 12/1994 | Kondoh et al. | 326/73 |
| 5,390,147 | * 2/1995 | Smarandoiu et al. | 365/189.11 |
| 5,438,287 | 8/1995 | Faue | 327/54 |
| 5,446,396 | 8/1995 | Brehmer | 327/66 |
| 5,612,630 | 3/1997 | Wright et al. | 326/22 |
| 5,627,789 | 5/1997 | Kalb, Jr. | 365/205 |
| 5,687,123 | 11/1997 | Hidaka et al. | 365/189.09 |
| 5,691,658 | 11/1997 | Klein | 327/104 |
| 5,789,981 | * 8/1998 | Singer et al. | 330/253 |
| 5,793,230 | * 8/1998 | Chu et al. | 327/77 |

(List continued on next page.)

FOREIGN PATENT DOCUMENTS

| | | | |
|---|---|---|---|
| 0397355 | 11/1990 | (EP) | G11C/7/06 |
| 0594305 | 4/1994 | (EP) | H03K/3/353 |
| 0681293 | 11/1995 | (EP) | G11C/7/00 |

OTHER PUBLICATIONS

Blalock, T.N., et al., "A High–Speed Clamped Bit–Line Current–Mode Sense Amplifier", *IEEE Journal of Solid–State Circuits*, 26(4), pp. 542–548, (Apr., 1991).

(List continued on next page.)

*Primary Examiner*—Timothy P. Callahan
*Assistant Examiner*—Terry L. Englund
(74) *Attorney, Agent, or Firm*—Schwegman, Lundberg, Woessner & Kluth, P.A.

(57) ABSTRACT

Structures and methods for high speed signaling over single sided/ended current sense amplifiers are provided. The present invention introduces hysteresis within a pseudo-differential current sense amplifier and provides it with adjustable thresholds for the detection of valid signals coupled with the rejection of small noise current transients or reflections and ringing when using low impedance interconnections and/or current signaling. The circuit provides a fast response time in a low power CMOS environment, and conserves circuit design space by allowing for single sided/ended sensing.

A first embodiment includes a current sense amplifier having a first amplifier and a second amplifier which are electrically coupled. Each amplifier includes a first transistor of a first conductivity type and a second transistor of a second conductivity type, where the first and second transistors are coupled at a drain region. A single signal input node is coupled to a source region of the first transistor of the first amplifier and receives a signal input current. A first signal output node is coupled to the drain region of the first and the second transistors in the second amplifier. The first signal output node is further coupled to a gate of a third transistor. A second signal output node is coupled to the drain region of the first and the second transistor in the first amplifier, and is further coupled to a gate of a fourth transistor. In one embodiment, a current mirror is coupled to the signal input node and the source regions of the first transistors in the first and the second amplifiers.

49 Claims, 8 Drawing Sheets

U.S. PATENT DOCUMENTS

| | | | |
|---|---|---|---|
| 5,804,994 | 9/1998 | Marlow et al. | 327/67 |
| 5,808,496 | 9/1998 | Thiel | 327/210 |
| 5,834,951 | 11/1998 | Klein | 327/53 |
| 5,841,718 | 11/1998 | Watters et al. | 365/208 |
| 5,850,365 | 12/1998 | Reese et al. | 365/207 |
| 5,955,899 | 9/1999 | Afghahi | 327/65 |
| 6,008,673 | 12/1999 | Glass et al. | 327/77 |
| 6,081,140 * | 6/2000 | King | 327/77 |

OTHER PUBLICATIONS

Blalock, T.N., et al., "A High–Speed Sensing Scheme for 1T Dynamic RAM's Utilizing the Clamped Bit–Line Sense Amplifier", *IEEE Journal of Solid–State Circuits*, 27(4), pp. 618–625, (Apr. 1992).

Blennemann, H., et al., "Off–Chip 400 MBPS Signal Transmission: Noise Reduction Using Non–Resonant Lengths and Other Techniques", *Proceedings of the IEEE Multi–Chip Module Conference*, pp. 138–142, (1996).

Campbell, J., "MOS Differential Comparators with Internal Hysteresis", *Motorola Technical Developments*, vol. 8, pp. 77–79, (Oct. 1988).

Ishibashi, K., et al., "A 6–ns 4–Mb CMOS SRAM with Offset–Voltage–Insensitive Current Sense Amplifiers", *IEEE Journal of Solid–State Circuits*, 30(4), pp. 480–486, (1995).

Lahiji, G.R., et al., "High–speed current–mode sense amplifier", *Electronic Letters*, 30(17), pp. 1371–1372, (Aug. 1994).

Rabaey, J.M., "Digital Integrated Circuits, a Design Perspective", Prentice Hall Electronics and VLSI Series, p. 489, (1996).

Sedra, A.S., et al., *Microelectronic Circuits*, 3rd Edition, Saunders College Publishing, pp. 864–867, (1991).

Seevinck, E., et al., "Current–Mode Techniques for High–Speed VLSI Circuits with Application to Current Sense Amplifier for CMOS SRAM's", *IEEE Journal of Solid State Circuits*, 26(4), pp. 525–536, (Apr. 1991).

Shibata, N., "Current Sense Amplifiers for Low–Voltage Memories", *IEICE Trans. Electron.*, E79–C(8), pp. 1120–1130, (Aug. 1996).

Zhang, H., et al., "Low–swing interconnect interface circuits", Symposium on Low Power Electronics and Design, Monterey, CA, pp. 161–166, (Aug. 1998).

Chirlian, *Analysis and Design of Integrated Electronic Circuits*, 1981, Harper & Row, p. 71.*

* cited by examiner

PSEUDO-DIFFERENTIAL CURRENT SENSE AMPLIFIER WITH HYSTERESIS

RELATED APPLICATIONS

This application is related to co-pending application Ser. No. 09/255,077, filed on Feb. 2, 1999, entitled "Pseudo-Differential Amplifiers" by inventor Leonard Forbes, which is hereby incorporated by reference. Further, this application is related to co-pending application Ser. No. 09/300,099, filed on Apr. 27, 1999, entitled "Current Sense Amplifier and Current Comparator with Hysteresis," by inventors Leonard Forbes and Eugene H. Cloud, which application is also incorporated herein by reference.

FIELD OF THE INVENTION

The present invention relates generally to integrated circuits. More particularly, it pertains to structures and methods for pseudo-differential current sense amplifiers and current comparators with hysteresis.

BACKGROUND OF THE INVENTION

Figure 1A:
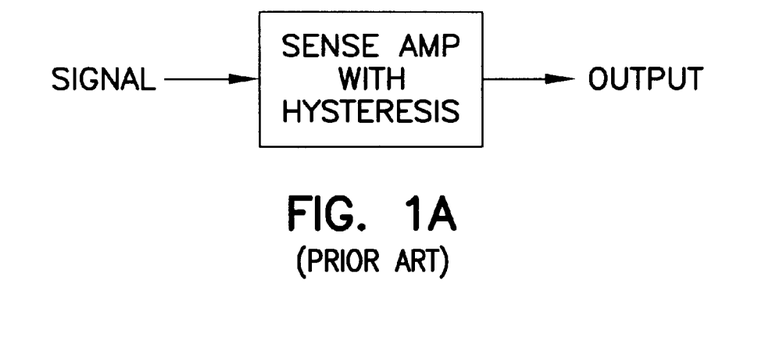
FIGS. 1A, 1B and 1C provide a representation of high and low trip points for a conventional voltage sense amplifier with hysteresis.
Figure 1B:
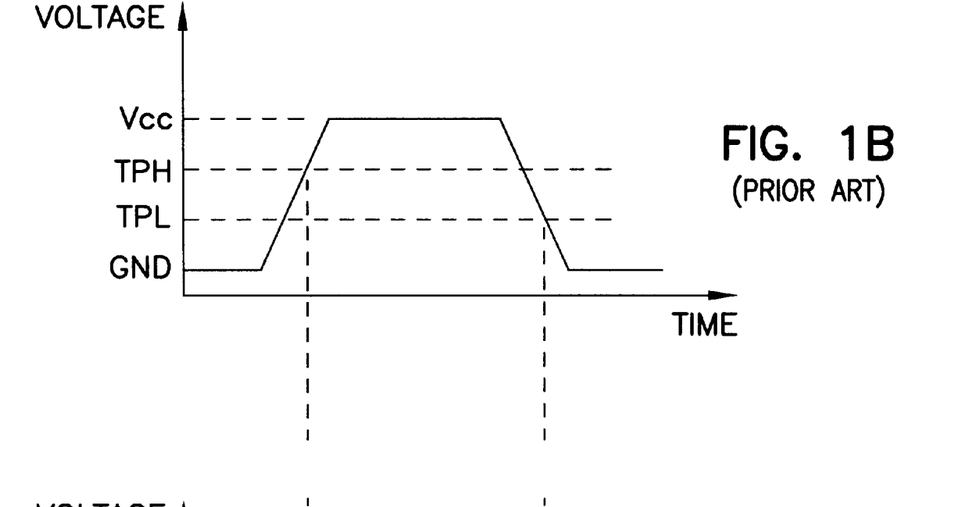
Figure 1C:
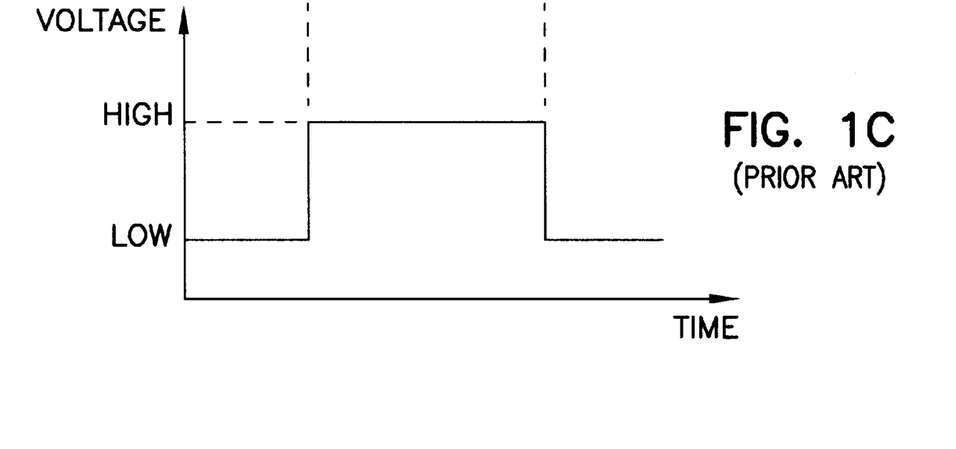

The use of voltage sense amplifiers with hysteresis for noise rejection is known. The simplest voltage sense amplifier is an operational amplifier in a positive feedback configuration. In the case of voltage hysteresis two different trip points (Tph and Tpl) are defined and circuits are designed such that when a high signal is to be recognized it must exhibit a voltage higher than Tph before it is recognized and declared a high signal. In a similar manner, before a low signal is recognized it must exhibit a low voltage lower than the second trip point Tpl. A simple illustration of this is provided in FIGS. 1A, 1B and 1C.

Presently, most CMOS integrated circuit interconnections rely on the transmission of a voltage step or signal from one location to another. The driver may simply be a CMOS inverter or NMOS transistor with a passive pull up load resistor and the receiver a simple CMOS amplifier, differential amplifier or comparator. The CMOS receiver presents a high impedance termination or load to the interconnection line. This fact is problematic for several identifiable reasons. For example, the high impedance termination is troublesome because the switching time response or signal delay is determined mainly by the ability of the driver to charge up the capacitance of the line and the load capacitance. Also, the interconnection line is not terminated by its characteristic impedance resulting in reflections and ringing, and large noise voltages may be induced on the signal transmission line due to capacitive coupling and large voltage switching on adjacent lines. The result is that the noise voltage can be a large fraction of the signal voltage.

The transmission of voltage step signals works well if the interconnection transmission line is short so that the stray capacitance of the line is small. However, in longer low impedance transmission lines, such as those which exist on most CMOS integrated circuits, the noise voltage presents a difficult problem. These longer low impedance transmission lines are in fact more amenable to current signaling. These longer transmission lines may be on the CMOS integrated circuit itself, an interconnection line between integrated circuits mounted in a module as for instance a memory module, an interposer upon which these integrated circuits are mounted, or on a printed circuit board upon which the integrated circuits are mounted.

In the quest for higher speed signaling it has recently been proposed to use current mode interconnections rather than voltage mode. The goal is to provide impedance matching on signal interconnection lines to reduce or avoid reflections and ringing on the lines. The technique proposed is matching termination of the signal line(s) to the signal receiver by using current mode interconnections and current mode sense amplifiers or current mode comparators. Signal interconnection and clock distribution lines with low controlled impedances are most amenable to current mode signaling. Metal lines separated from metal ground planes or metal power supply distribution planes (which are at AC ground) by oxide or other integrated circuit insulators will have low characteristic impedances of the order 50 or 75 ohms. To avoid reflections and ringing these need to be terminated in their characteristic impedance which requires sense amplifiers or receivers with low input impedances and implies small voltage swings on the lines.

Independent of whether voltage signals or current-mode signals are employed two different types of interconnections exist, the first type includes single sided/single ended interconnections and the second type includes differential interconnections. Differential interconnections are often desirable in that they reduce common mode noise. However, differential interconnections require two interconnection transmission lines and, in I/O applications, they require twice as many input/output pads and packaging pins which is a problem in some applications. The requirement of two interconnection transmission lines creates twice as much crowding on the precious chip surface area available in certain CMOS applications. Single sided/single ended pseudo differential interconnections have some of the advantages of differential interconnections, like power supply noise rejection. Single sided/single ended pseudo differential interconnections use a single transmission line interconnection.

Figure 2:
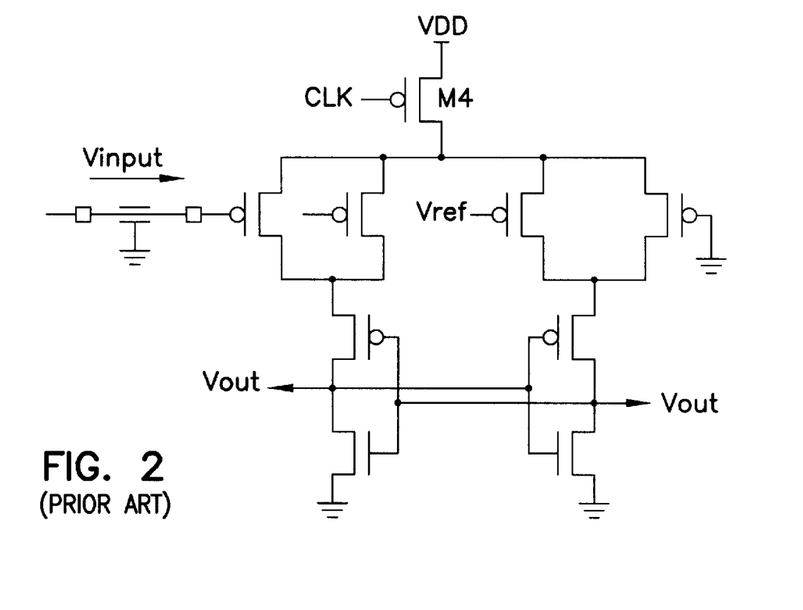
FIG. 2 provides a schematic for a conventional "pseudo-differential" amplifier.

In the "quasi-differential" amplifier, a single transmission line interconnection is utilized and one input of the voltage sense amplifier driven with a reference potential. The "quasi-differential" technique, and with voltage sensing on a terminated line has been used in 400 Mbs CMOS systems. FIG. 2 provides a schematic for a conventional "pseudo-differential" amplifier. In the "pseudo-differential" amplifier technique one side of the different type of voltage sense amplifier is driven with a combination of ground potential and a reference potential. Unfortunately, achieving high data rates is difficult with single-ended or unbalanced signal transmission lines at high frequencies because a large amount of noise is generated in the interconnection system including crosstalk and radiation in backplanes, connectors and cables.

Figure 3:
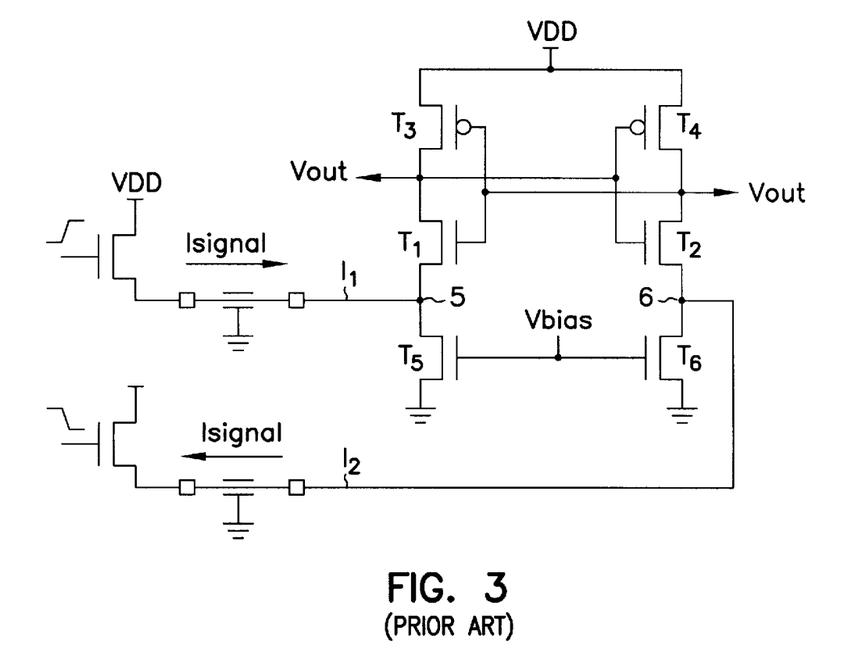
FIG. 3 is an illustration of a conventional differential current sense amplifier.

FIG. 3 provides an illustration of the conventional differential current sense amplifier. This conventional current sense amplifier, receiving fully differential input signals, can respond more rapidly than those single ended/single sided amplifiers mentioned above. Also, the fully differential sense amplifier has lower power constraints and can be driven with a small 0.5 mA input signal on the input transmission lines. However, the conventional differential current sense amplifier is not very responsive to single sided or single ended input signals where one side, or input, is driven with a reference current signal, e.g. zero Amperes and the other input is used in an attempt to detect a current signal. When used in such a manner the response of the current sense amplifier with a single sided input is very poor. There is simply not enough gain and feedback in the positive feedback latch to result in a large output signal for a 1 milliampere (mA) input signal. Instead a larger 5 mA input signal is required which places greater power demands on the overall CMOS circuit.

For the reasons stated above, and for other reasons stated below which will become apparent to those skilled in the art upon reading and understanding the present specification, it is desirable to develop sense amplifiers which are even less susceptible to induced noise, current reflections or ringing. It is further desirable to develop low power sense amplifiers which provide rapid response times using single sided/ended inputs.

SUMMARY OF THE INVENTION

The above mentioned problems for high speed signaling over single sided/ended current sense amplifiers as well as other problems are addressed by the present invention and will be understood by reading and studying the following specification. The present invention introduces hysteresis within a pseudo-differential current sense amplifier and provides it with adjustable thresholds for the detection of valid signals coupled with the rejection of small noise current transients or reflections and ringing when using low impedance interconnections and/or current signaling.

In particular, an illustrative embodiment of the present invention includes a novel pseudo-differential current sense amplifier circuit with hysteresis. The circuit provides a fast response time in a low power CMOS environment. A first embodiment includes a current sense amplifier having a first amplifier and a second amplifier which are electrically coupled. Each amplifier includes a first transistor of a first conductivity type and a second transistor of a second conductivity type, where the first and second transistors are coupled at a drain region. A single signal input node is coupled to a source region of the first transistor of the first amplifier and receives a signal input current. A first signal output node is coupled to the drain region of the first and the second transistor in the second amplifier. The first signal output node is further coupled to a gate of a third transistor. A second signal output node is coupled to the drain region of the first and the second transistor in the first amplifier, and is further coupled to a gate of a fourth transistor. In one embodiment, a current mirror is coupled to the signal input node and the source regions of the first transistors in the first and the second amplifiers.

Integrated circuits, electrical systems, methods of operation and methods of forming the novel current sense amplifier are similarly included. The novel pseudo differential current sense amplifier circuit facilitates the introduction of hysteresis which provides the added ability to differentiate true signals from noise transients, and conserves circuit design space by allowing for single sided/ended sensing.

These and other method embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DETAILED DESCRIPTION

In the following detailed description of the invention, reference is made to the accompanying drawings which form a part hereof, and in which is shown, by way of illustration, a specific embodiment in which the invention may be practiced. In the drawings, like numerals describe substantially similar components throughout the several views. The embodiment is described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims, along with the full scope of equivalents to which such claims are entitled.

Figure 4:
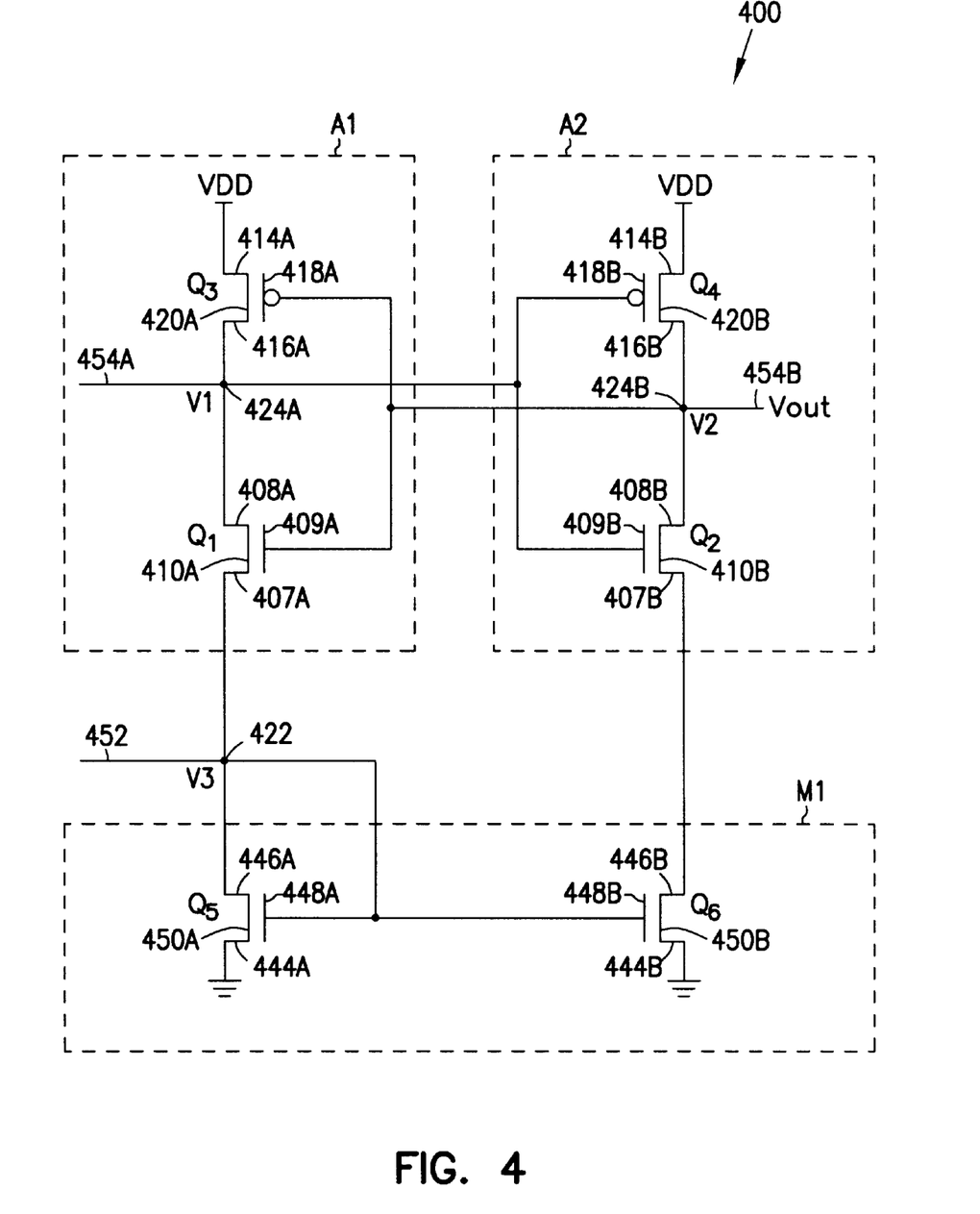
FIG. 4 is a schematic diagram which illustrates a novel pseudo-differential amplifier circuit according to the teachings provided in co-pending application Ser. No. 09/255,077.

FIG. 4 is a schematic diagram which illustrates a novel pseudo-differential amplifier circuit according to the teachings provided in co-pending application Ser. No. 09/255, 077, by inventor Leonard Forbes, which is hereby incorporated by reference. FIG. 4 illustrates a pair of cross coupled amplifiers, A1 and A2. In the embodiment shown in FIG. 4, the pair of cross coupled amplifiers, A1 and A2, comprise two cross coupled inverters. Each amplifier, A1 and A2, includes a first transistor, Q1 and Q2 respectively, of a first conductivity type. Each first transistor Q1 and Q2 includes a source region, 407A and 407B respectively. Each first transistor Q1 and Q2 includes a drain region, 408A and 408B. Also, each first transistor Q1 and Q2 includes a gate, 409A and 409B, opposing a body region 410A and 410B. Each amplifier, A1 and A2, includes a second transistor Q3 and Q4 of a second conductivity type. Each second transistor Q3 and Q4 includes a source region, 414A and 414B respectively. Each second transistor Q3 and Q4 includes a drain region, 416A and 416B. Also, each second transistor Q3 and Q4 includes a gate, 418A and 418B, opposing a body region 420A and 420B. In one embodiment, each first transistor, Q1 and Q2, of a first conductivity type includes a metal oxide semiconductor field effect transistor (MOSFET). In one embodiment, each first transistor, Q1 and Q2, of a first conductivity type includes an n-channel metal-oxide semiconductor (NMOS) transistor. In one embodiment, each second transistor, Q3 and Q4, of a second conductivity type includes a metal oxide semiconductor field effect transistor (MOSFET). In one embodiment, each second transistor, Q3 and Q4, of a second conductivity type includes a p-channel metal-oxide semiconductor (PMOS) transistor. In an exemplary embodiment, the NMOS and PMOS transistors are fabricated according to a complementary metal oxide semiconductor (CMOS) process technology.

In FIG. 4, a single signal input node 422 is coupled to the source region, 407A or 407B for one of the first transistors, Q1 and Q2, in the pair of cross coupled amplifiers A1 and A2. By way of illustration, and not by way of limitation, FIG. 4 shows the single signal input node 422 coupled to the source region 407A of transistor Q1. A signal output node 424A and 424B in each inverter A1 and A2 is coupled to the drain regions 408A and 408B of the first transistors Q1 and Q2 as well as to the drain regions 416A and 416B of each second transistor Q3 and Q4. The signal output nodes 424A and 424B in each one of the cross coupled inverters A1 and A2 is further coupled to the gates of the first and the second transistors in the other inverter. Hence, signal output node 424A is coupled to gates 409B and 418B of inverter A2, and signal output node 424B is coupled to gates 409A and 418A of inverter A1. In one embodiment, the signal output nodes 424A and 424B are coupled respectively to a pair of output transmission lines 454A and 454B. The single signal input node 422 is additionally coupled to a current mirror M1. In one embodiment, a transmission line 452 which has a characteristic impedance (Zo) of less than 50 Ohms is coupled to the signal input node 422.

In FIG. 4, a third transistor, Q5 and Q6 respectively, of a first conductivity type is coupled to each amplifier, A1 and A2. Each third transistor Q5 and Q6 includes a source region, 444A and 444B respectively. Each third transistor Q5 and Q6 includes a drain region, 446A and 446B. Also, each third transistor Q5 and Q6 includes a gate, 448A and 448B, opposing a body region 450A and 450B. The drain region 446A and 446B for each third transistor, Q5 and Q6, is coupled to the source region, 407A and 407B, for each first transistor Q1 and Q2 in the pair of cross coupled amplifiers A1 and A2. The single signal input node 422 additionally couples to the gate, 448A and 448B, for each third transistor Q5 and Q6. In one embodiment, each third transistor, Q5 and Q6, of a first conductivity type comprise a second pair of MOSFETs of a first conductivity type for the novel pseudo differential amplifier circuit 400. In this embodiment, the second pair of MOSFETs of a first conductivity type includes a pair of NMOS transistors Q5 and Q6. Also in this embodiment, the pair of NMOS transistors Q5 and Q6 are part of the current mirror M1. Here, a drain region, 446A and 446B, for each one of the pair of NMOS transistors Q5 and Q6 in the current mirror M1 is coupled to a source region, 407A and 407B respectively, for each NMOS transistor Q1 and Q2 in the pair of cross coupled inverters A1 and A2. The single signal input node 422 is coupled to a gate on each one of the pair of NMOS transistors Q5 and Q6 in the current mirror M1.

FIG. 3 has been provided in illustration of a conventional differential current sense amplifier. In operation, the conventional differential current sense amplifier employs two input signal lines, I1 and I2 for fully differential signaling. In the illustration of FIG. 3, a signal current injected at node 5 causes the source current of transistor T1 to decrease. Likewise, a signal current being extracted from node 6 causes the source current of transistor T2 to increase. The ratio of the currents being injected into the source of T1 and the drain of T5 is determined by the input impedances looking into these terminals. Again, the problem has been stated that in certain circuit applications the requirement of two input signal lines I1 and I2 can quickly exhaust available chip surface area.

In contrast, the novel pseudo-differential amplifier circuit according to the teachings provided in co-pending application Ser. No. 09/255,077 eliminates this special problem by facilitating differential sensing capability using a single ended receiver. The manner in which the same can be achieved is explained using FIG. 4. In FIG. 4, the two independent transistors, T5 and T6, shown at the bottom of FIG. 3 for the conventional differential current sense amplifier, have been replaced by current mirror M1. The current mirror M1 in FIG. 4 converts a single ended input current received at the single signal input node 422 into a differential input signal. In example, output nodes 424A and 424B are precharged to a voltage potential prior to the sensing operation. Next, a current signal is input from input transmission line 452 into single signal input node 422. When the current signal arrives at single signal input node 422 a portion of the signal flows into the gates 448A and 448B for transistors Q5 and Q6 serving to turn "on" these transistors. This creates conduction between source region 444A and drain region 446A of transistor Q5 as well as between source region 444B and drain region 446B of transistor Q6. If the input current signal flows into the drain region 446A of transistor Q5 then some current will also flow into the source region 407A of transistor Q1. The current flowing into the source region 407A of transistor Q1 will decrease the current flowing out of the drain region 416A of transistor Q3 and out of the source region 407A of transistor Q1. The precharged voltage potential, or node voltage V1, at output node 424A will subsequently increase which serves to turn transistor Q2 on and turn off transistor Q4. At the same time, an increase in the conduction between source region 444A and drain region 446A in transistor Q5 will cause the potential, or node voltage V3, at the signal input node 422 to increase which in turn increases the voltage on gate 448B of transistor Q6. An increasing gate voltage on transistor Q6 will further turn on transistor Q6 such that transistor Q6 conducts more current through transistor Q6 between drain region 446B and source region 444B. This increase in conduction through transistor Q6 will tend to cause the current flowing out of the source region 407B of transistor Q2 to increase. The increased conduction through transistors Q2 and Q6 tend to pull signal output node 424B to ground reducing the node voltage V2 at signal output node 424B. As the node voltage V2 of signal output node 424B is reduced, transistor Q3 is further turned on. In this manner, the single ended receiver, or pseudo differential amplifier circuit 400 operates in a differential amplifier fashion. The single ended current signal which was input from transmission line 452 into signal input 422 is thus converted into a differential current signal in that the source current at source region 407A of transistor Q1 tends to decrease and the source current at source region 407B of transistor Q2 tends to increase. In result, the novel pseudo-differential amplifier circuit according to the teachings provided in co-pending application Ser. No. 09/255,077 produces the same effect that a fully differential signal would have on a conventional differential current sense amplifier as that shown in FIG. 3. Meanwhile, the novel pseudo-differential amplifier circuit according to the teachings provided in co-pending application Ser. No. 09/255,077 circumvents the necessity of having two transmission lines as in a conventional differential current sense amplifier. The novel pseudo-differential amplifier circuit 400 according to the teachings provided in co-pending application Ser. No. 09/255,077 can latch a voltage output signal on the pair of signal output nodes, 424A and 424B, and thus the pair of output transmission lines 454A and 454B when a single sided current signal of 2.0 mA or less is received at the single signal input node 422. The novel pseudo-differential amplifier circuit 400 according to the teachings provided in co-pending application Ser. No. 09/255,077 can latch this voltage output signal to the pair of signal output nodes, 424A and 424B in less than 300 nanoseconds (ns). This is a very rapid response time on par with that provided by conventional differential current sense amplifiers. Further, the novel pseudo-differential amplifier circuit according to the teachings provided in co-pending application Ser. No. 09/255,077 is fully capable of fabrication in a streamlined CMOS process. However, novel pseudo-differential amplifier circuit according to the teachings provided in co-pending application Ser. No. 09/255,077 does not provide a means for introducing hysteresis into the circuit 400.

Figure 5A:
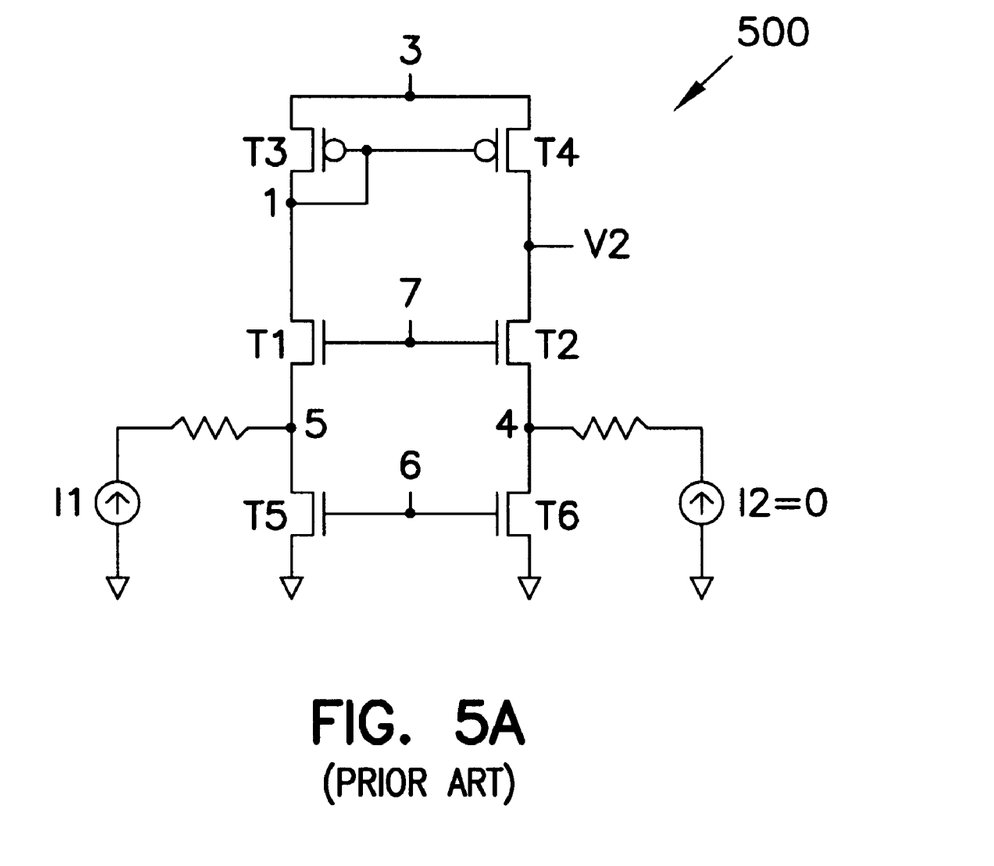
FIG. 5A is a schematic illustration of another conventional differential current sense amplifier similar to that shown in FIG. 4 but having only a single output node.
Figure 5B:
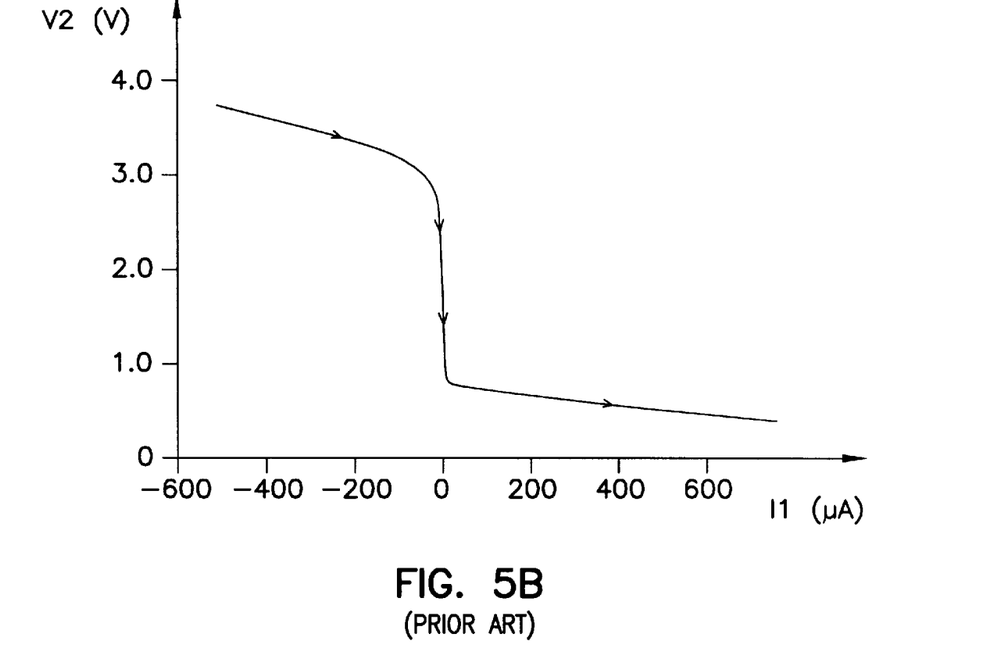
FIG. 5B is a graphical representation of the current versus voltage (I–V) curve of the conventional current sense amplifier shown in FIG. 5A.

FIG. 5A is a schematic illustration of another conventional differential current sense amplifier 500 similar to that shown in FIG. 4 but having only a single output node. In FIG. 5A, the conventional current sense amplifier 500 is shown driven with a single ended or single sided input, I1. The other differential input, I2, is held at zero amperes. The output voltage (V2) is given by −Zv(I1−I2), where Zv is the transimpedance (Gain) for the conventional current sense amplifier 500. This transimpedance, Zv, is very high until the output voltage, V2, clamps at either a high level or a low level. In operation, the conventional current sense amplifier 500 wants to be symmetrically balanced. A current, I1, injected into node 5 will see a high impedance looking into transistor T5 and a lower impedance looking into transistor T1. Therefore, the injected current, I1, flows mostly into transistor T1. This will subtract, or reduce, the amount of current flowing down the left hand side of the conventional current sense amplifier 500 through transistor T3. In result, the potential at node 1 increases which places a higher potential on the gate of T4. As the gate potential of transistor T4 increases, transistors T2 and T6 operate to pull the output voltage, V2, down toward ground. FIG. 5B is a graphical representation of the current versus voltage (I–V) curve of the conventional current sense amplifier 500 shown in FIG. 5A.

Figure 5C:
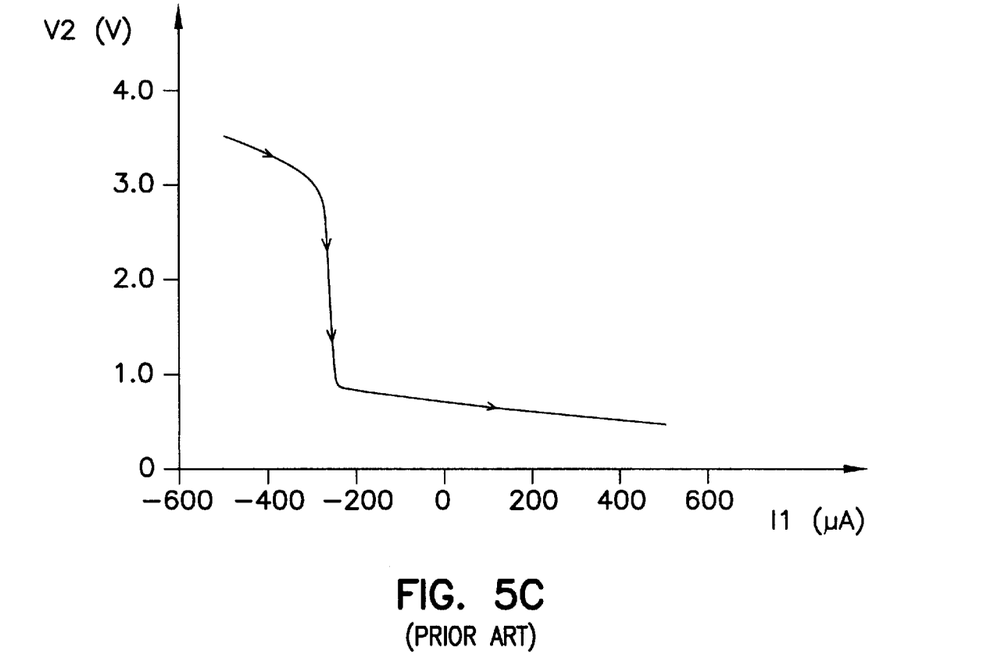
FIG. 5C is another graphical representation of the current versus voltage (I–V) curve of the conventional current sense amplifier shown in FIG. 5A, when current is fed to its second signal input node.

FIG. 5C is another graphical representation of the current versus voltage (I–V) curve of the conventional current sense amplifier 500 shown in FIG. 5A. In this embodiment, the conventional current sense amplifier is driven with two inputs, or a differential signal, where I2=−250 microAmperes (µA). Here, the output voltage, V2, changes states when I1=−250 µA, so that (I1−I2) first becomes positive and −Zv(I1−I2) goes to the most negative value.

Figure 6A:
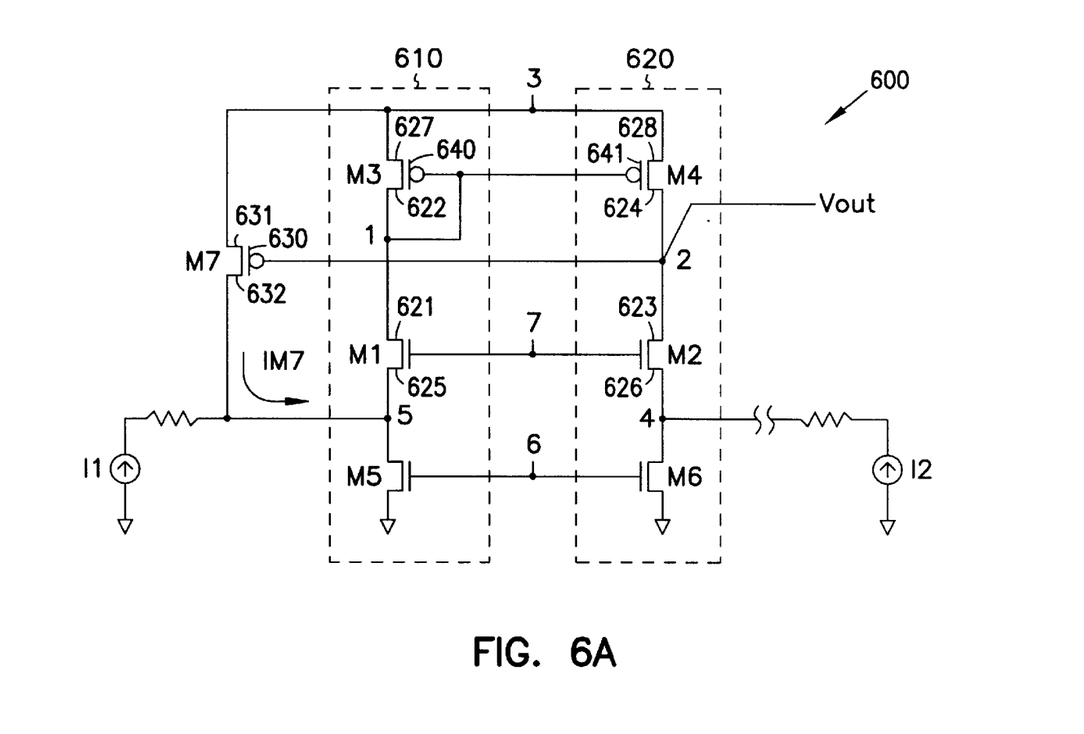
FIG. 6A is a schematic illustration of a current sense amplifier or current comparator according to the teachings co-pending application Ser. No. 09/300,099.

FIG. 6A is a schematic illustration of a current sense amplifier 600, or current comparator 600, according to the teachings of co-pending application Ser. No. 09/300,099. As shown in FIG. 6A, the current sense amplifier 600 includes a first amplifier 610, or left side 610, and a second amplifier 620, or right side 620. Each amplifier, 610 and 620, includes a first transistor of a first conductivity type, M1 and M2 respectively. Each amplifier, 610 and 620, includes a second transistor of a second conductivity type, M3 and M4 respectively. In one embodiment, the first transistor of a first conductivity type, M1 and M2, includes an n-channel metal oxide semiconductor (NMOS) transistor, M1 and M2. In this embodiment, the second transistor of a second conductivity type, M3 and M4, includes a p-channel metal oxide semiconductor (PMOS) transistor, M3 and M4. Transistors M1 and M2 are driven by a gate potential at node 7. Each amplifier, 610 and 620, includes a current sink, shown in FIG. 6A as transistors M5 and M6 which are driven by a gate potential at node 6. The first and second transistors, M1 and M3, of the first amplifier 610 are coupled at a drain region, 621 and 622 respectively, to node 1.

Node 1 couples the drain region, 621 and 622, for the first and the second transistor, M1 and M3, in the first amplifier 610 to gates, 640 and 641, of the second transistor, M3 and M4, in the first and the second amplifier 610 and 620. The first and second transistors, M2 and M4, of the second amplifier 620 are coupled at a drain region, 623 and 624 respectively. In the embodiment shown in FIG. 6A, a signal output node 2 is coupled to the drain region, 623 and 624, of the first and the second transistor, M2 and M4, in the second amplifier 620. In an alternative embodiment, the signal output node 2 can be coupled to the drain region, 621 and 622, of the first and the second transistor, M1 and M3, in the first amplifier 610. As shown in FIG. 6A the signal output node is further coupled to a gate 630 of a third transistor M7. In one embodiment, the third transistor M7 is a p-channel metal oxide semiconductor (PMOS). Each amplifier, 610 and 620, includes a signal input node, 5 and 4 respectively, which is coupled to a source region, 625 and 626, of the first transistor, M1 and M2.

A source region, 627 and 628, for the second transistor, M3 and M4 respectively, in the first and second amplifier, 610 and 620, is coupled to a voltage supply Vdd at node 3. In one embodiment, a source region 631 of the third transistor M7 is coupled to a source region 627 of the second transistor M3 in the first amplifier 610. In this embodiment, a drain region 632 of the third transistor M7 is coupled to the signal input node 5 of the first amplifier 610. In one embodiment, the signal input node 5 of the first amplifier 610 receives an input current, I1, and the signal input node 4 of the second amplifier 620 receives a reference current, I2.

Figure 6B:
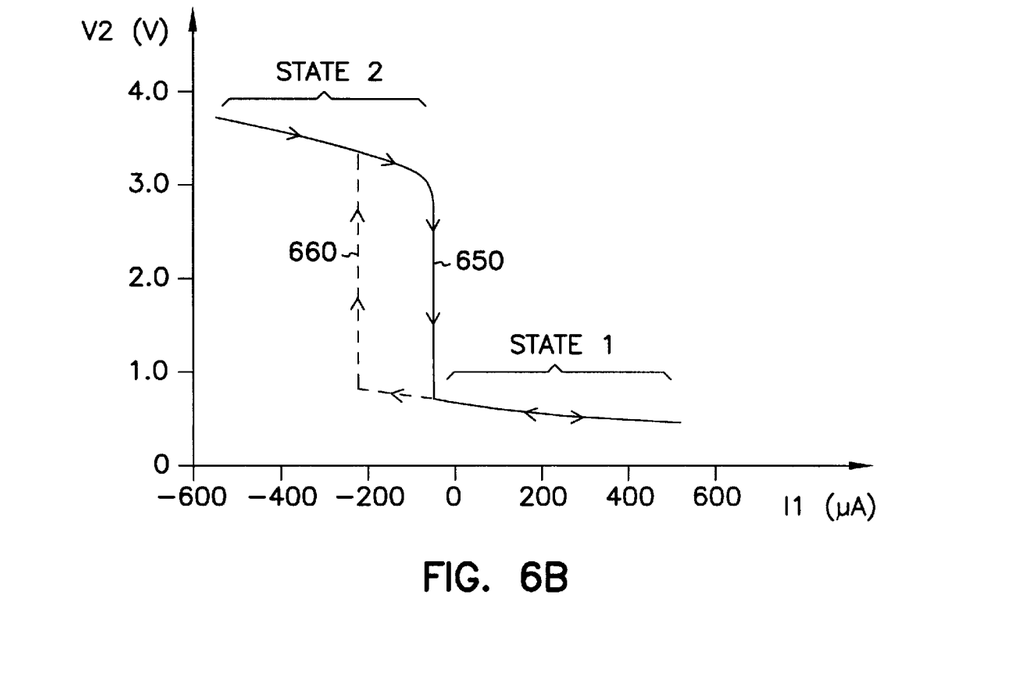
FIG. 6B is an I–V graph illustrating one embodiment of the operation of the current sense amplifier shown in FIG. 6A, according to the teachings copending application Ser. No. 09/300,099.

FIG. 6B is an I–V graph illustrating one embodiment of the operation of the current sense amplifier 600, shown in FIG. 6A, according to the teachings of co-pending application Ser. No. 09/300,099. The operation of the novel current sense amplifier circuit 600 is explained by reference to FIGS. 6A and 6B. The third transistor M7 introduces a controlled hysteresis into the current sense amplifier 600 of FIG. 6A. Beginning at the right hand side of the graph, FIG. 6B illustrates the output voltage, V2, at a low state, or first state, output voltage. The low, or first state, output voltage, V2, turns on third transistor M7 which then drives a current, IM7, into node 5, the signal input node 5 for the first amplifier 610. In other words, the third transistor M7 provides an input current, IM7, into node 5. A single ended input current, I1, injected into input signal node 5 is supplemented by the input current, IM7. In order for the current sense amplifier 600 to switch the state of output voltage, V2, the current injected into the signal input node 5 must upset, or "trip" the balance of the current sense amplifier 600. In this embodiment, the signal input node 4 is held at a differential/reference signal, I2, of zero amperes. At this point, the output voltage, V2, of the current sense amplifier 400 is given by V2=−Zv((I1+IM7)−I2). Here, the value of ((I1+IM7)−I2) must become negative for the output voltage, V2, to go to a second state, or high state.

Because of the supplemented current, IM7, being driven by the third transistor M7, the input current I1 will not "trip" the state of the current sense amplifier 600 until I1 passes below a certain negative current value, i.e. a low trip point, shown at 660 in FIG. 6B. As one of ordinary skill in the art will understand upon reading this disclosure, the size and doping levels of the third transistor M7 can be varied to provide a set magnitude of input current, IM7, into node 4. In this manner, the circuit design of the current sense amplifier 600, shown in FIG. 6A, according to the teachings of co-pending application Ser. No. 09/300,099 can be manipulated to introduce a range of hysteresis for negative or low values of input current I1 into the current sense amplifier 600. The set hysteresis introduced, by the addition of the third transistor M7, allows the current sense amplifier 600, shown in FIG. 6A, according to the teachings of co-pending application Ser. No. 09/300,099 to discriminate against small transient noise values which would otherwise cause the current sense amplifier to switch states prematurely and provide an inaccurate output voltage, V2.

In reverse operation, the single ended input current, I1, is increased from a lower value, e.g. below trip point value 650. As shown in FIG. 6B, while the input current, I1, is below trip point 650 the output voltage, V2, will be at a high state, or second state, output voltage. In this high, second state, the voltage potential applied to gate 630 of the third transistor M7 will not turn "on" transistor M7. Thus, the third transistor M7 is effectively removed from the current sense amplifier circuit 600. In the embodiment of FIGS. 6A and 6B, node 4 will see a reference current, I2, here held at zero amperes. With the third transistor M7 turned "off," the third transistor M7 is not providing any input current, IM7, into node 5. As explained above, the single ended input current, I1, must upset the balance of the current sense amplifier 600 in the opposite direction in order for the current sense amplifier 600 to switch states again, e.g. the input current, I1, must overcome the differential signal, I2, of zero amperes. At this point, the output voltage, V2, of the current sense amplifier 600 is given by V2=−Zv(I1−I2) since the third transistor M7 is removed from the current sense amplifier circuit 600. However, the current sense amplifier 600, shown in FIG. 6A, according to the teachings of co-pending application Ser. No. 09/300,099 does not provide single sided/ended sensing capabilities.

Figure 7A:
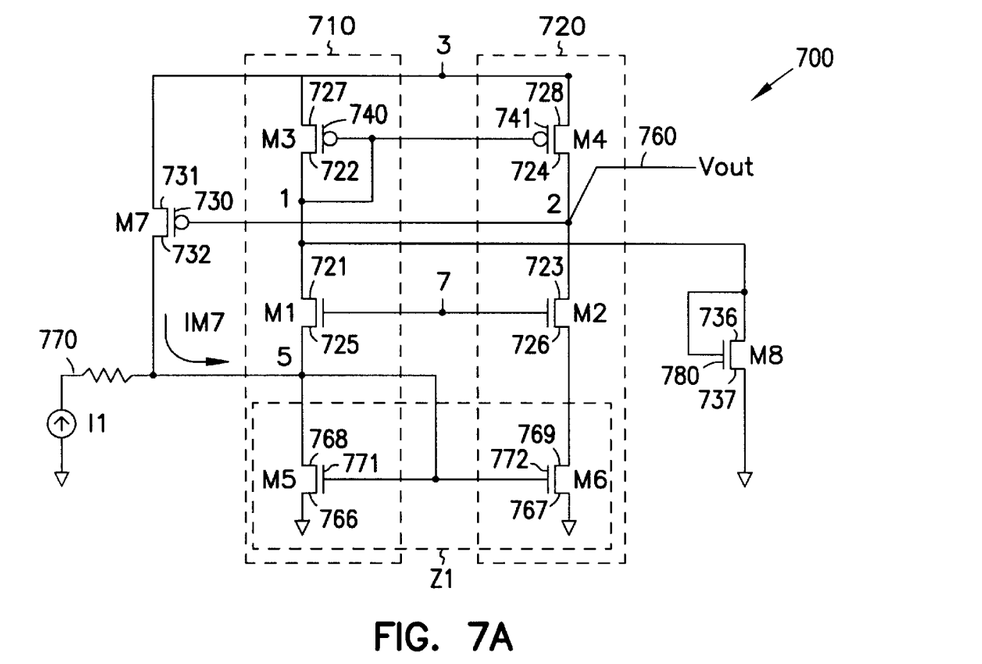
FIG. 7A is a schematic illustration of a current sense amplifier or current comparator according to the teachings of the present invention which provides for pseudo-differential current sensing capabilities with the added capability of introducing hysteresis into the circuit.

FIG. 7A is a schematic illustration of a current sense amplifier 700, or current comparator 700, according to the teachings of the present invention which provides for pseudo-differential current sensing capabilities with the added capability of introducing hysteresis into the circuit 700.

As shown in FIG. 7A, the novel pseudo-differential current sense amplifier 700 includes a first amplifier 710, or left side 710, and a second amplifier 720, or right side 720. Each amplifier, 710 and 720, includes a first transistor of a first conductivity type, M1 and M2 respectively. Each first transistor M1 and M2 includes a source region, 725 and 726 respectively. Each first transistor M1 and M2 includes a drain region, 721 and 723. Also, each first transistor M1 and M2 includes a gate opposing a body region. Each amplifier, 710 and 720, includes a second transistor of a second conductivity type, M3 and M4 respectively. Each second transistor M3 and M4 includes a source region, 727 and 728 respectively. Each second transistor M3 and M4 includes a drain region, 722 and 724. Also, each second transistor M3 and M4 includes a gate, 740 and 741, opposing a body region. In one embodiment, the first transistor of a first conductivity type, M1 and M2, includes an n-channel metal oxide semiconductor (NMOS) transistor, M1 and M2. In this embodiment, the second transistor of a second conductivity type, M3 and M4, includes a p-channel metal oxide semiconductor (PMOS) transistor, M3 and M4. Transistors M1 and M2 are driven by a gate potential at node 7. The first and second transistors, M1 and M3, of the first amplifier 710 are coupled at drain regions, 721 and 722 respectively, to node 1.

Node 1 further couples the drain regions, 721 and 722, for the first and the second transistor, M1 and M3, in the first amplifier 710 to gates, 740 and 741, of the second transistor, M3 and M4, in the first and the second amplifier 710 and 720. The first and second transistors, M2 and M4, of the second amplifier 720 are coupled at a drain region, 723 and 724 respectively.

In FIG. 7A, a first signal output node 2 is coupled to the drain region, 723 and 724, of the first and the second transistor, M2 and M4, in the second amplifier 720. The first signal output node 2 couples to an output transmission line 760. As shown in FIG. 7A the first signal output node 2 is further coupled to a gate 730 of a third transistor M7. A source region, 727 and 728, for the second transistor, M3 and M4 respectively, in the first and second amplifier, 710 and 720, is coupled to a voltage supply Vdd at node 3.

As shown in FIG. 7A, a single input transmission line 770 is coupled to a single signal input node 5 in the first amplifier 710. In one embodiment, the single input transmission line 770 has a characteristic impedance (Zo) of less than 50 Ohms. As shown in FIG. 7A, the signal input node 5 of the first amplifier 710 receives an input current, I1. The single signal input node 5 is coupled to the source region 725 for the first transistor, M1, in the first amplifier 710. In one embodiment, the source region 731 of the third transistor M7 is coupled to a source region 727 of the second transistor M3 in the first amplifier 710. In this embodiment, a drain region 732 of the third transistor M7 is coupled to the signal input node 5 on the first amplifier 710, thereby providing a first feedback from the first signal output node 2 of the current sense amplifier (M7) to a signal input node 5, wherein providing a first feedback from a first signal output node 5 to the signal input node 2 introduces a hysteresis into the current sense amplifier in order to discriminate against noise transients. In one embodiment, the third transistor M7 is an p-channel metal oxide semiconductor (PMOS).

Node 1 further serves as a second output node 1. Node 1 is coupled to a fourth transistor M8. Transistor M8 includes a source region 737, a drain region 736, and a gate 780 opposing a body region. As shown in FIG. 7A, node 1 couples to the drain region 736 and the gate 780 of transistor M8. In the embodiment, shown in FIG. 7A, the source region 737 of transistor M8 is coupled to ground, thereby providing a path from the second signal output node 1 of the current sense amplifier M8 to ground, wherein providing a path from the second signal output node 1 to ground introduces a hysteresis into the current sense amplifier in order to discriminate against noise transients. In one embodiment, the fourth transistor M8 includes an n-channel metal oxide semiconductor (NMOS).

As shown in FIG. 7A, the single signal input node 5 is additionally coupled to a current mirror Z1. Current mirror Z1 includes a fifth transistor M5 and a sixth transistor M6. The fifth and sixth transistors, M5 and M6, include a source region, 766 and 767 respectively. The fifth and sixth transistors, MS and M6, include a drain region, 768 and 769 respectively. The fifth and sixth transistors, MS and M6, each have a gate, 771 and 772 respectively. As shown in FIG. 7A, the gates, 771 and 772, of the fifth and sixth transistors are coupled to one another. The source regions, 766 and 767, of the fifth and sixth transistors, M5 and M6, are coupled to ground. The drain regions, 768 and 769, of the fifth and sixth transistors, M5 and M6, are coupled to the source regions, 725 and 726 respectively, in the first transistors, M1 and M2, in the first and second amplifiers, 710 and 720. As shown in FIG. 7A, the single signal input node 5 is coupled to the gates, 771 and 772, of the fifth and sixth transistors, M5 and M6.

Figure 7B:
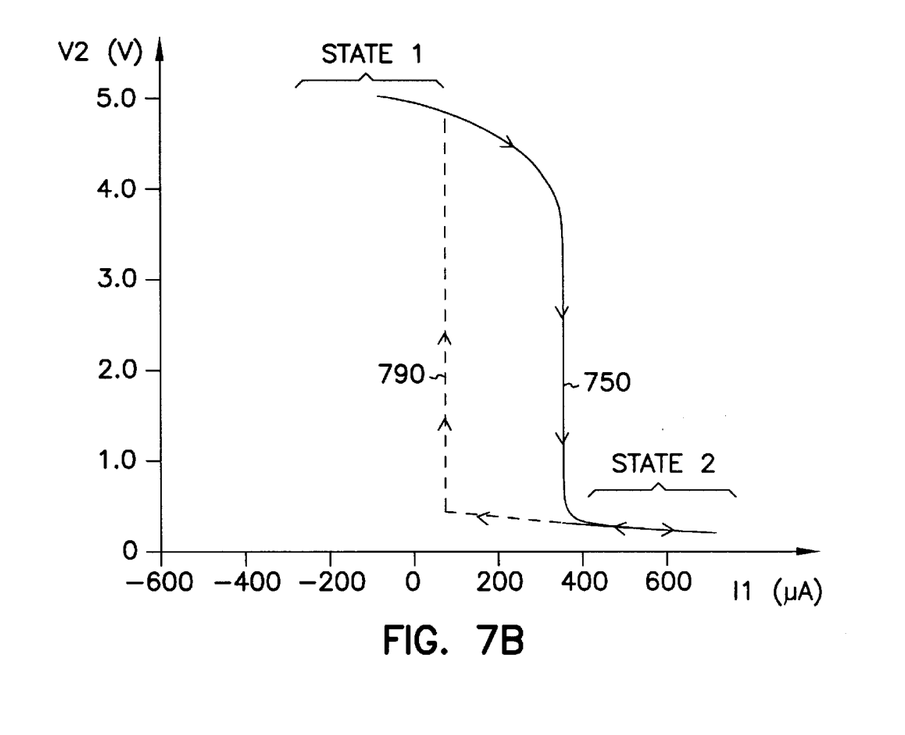
FIG. 7B is an I–V graph illustrating one embodiment of the operation of the novel pseudo-differential current sense amplifier shown in FIG. 7A, according to the teachings of the present invention.

FIG. 7B is an I–V graph illustrating one embodiment of the operation of the novel pseudo-differential current sense amplifier 700, shown in FIG. 7A, according to the teachings of the present invention. The operation of the novel pseudo-differential current sense amplifier circuit 700 is best explained in reference to FIGS. 7A and 7B and FIG. 3. FIG. 3 has been provided in illustration of a conventional differential current sense amplifier. In operation, the conventional differential current sense amplifier employs two input signal lines, I1 and I2 for fully differential signaling. In the illustration of FIG. 3, a signal current injected at node 5 causes the source current of transistor T1 to decrease. Likewise, a signal current being extracted from node 6 causes the source current of transistor T2 to increase. Thus the differential effect of the conventional current sense amplifier is shown. The ratio of the currents being injected into the source of T1 and the drain of T5 is determined by the input impedances looking into these terminals. Again, the problem has been stated that in certain circuit applications the requirement of two input signal lines I1 and I2 can quickly exhaust available chip surface area.

In contrast, the novel pseudo-differential current sense amplifier circuit 700 according to the teachings of the present invention eliminates this special problem by facilitating differential sensing capability using a single ended receiver. The manner in which the same can be achieved is explained using FIG. 7A. In FIG. 7A, the two independent transistors, T5 and T6, shown at the bottom of FIG. 3 for the conventional differential current sense amplifier, have been replaced by current mirror Z1. The current mirror Z1 in FIG. 7A converts a single ended input current received at the single signal input node 5 into a differential input signal. In example, transistors M1 and M2 are driven with a gate potential from node 7 prior to the sensing operation. Next, a current signal I1 is injected from the single signal input transmission line 770 into single signal input node 5. When the current signal arrives at single signal input node 5 a portion of the signal flows into the gates 771 and 772 for transistors M5 and M6 serving to turn "on" these transistors. This creates conduction between source region 766 and drain region 768 of transistor M5 as well as between source region 767 and drain region 769 of transistor M6. If the input current signal flows into the drain region 768 of transistor M5 then some current will also flow into the source region 725 of transistor M1.

The current flowing into the source region 725 of transistor M1 will decrease the current flowing out of the drain region 722 of transistor M3 and out of the source region 725 of transistor M1. The node voltage V1, at the second output node 1 will subsequently increase which acts to turn "off" transistor M4. At the same time, an increase in the conduction between source region 766 and drain region 768 in transistor M5 will cause the potential, or node voltage V5, at the signal input node 5 to increase which in turn increases the voltage on gate 772 of transistor M6. An increasing gate voltage on transistor M6 will further turn on transistor M6 such that transistor M6 conducts more current through transistor M6 between drain region 769 and source region 767. This increase in conduction through transistor Q6 will tend to cause the current flowing out of the source region 767 of transistor M2 to increase. The increased conduction through transistors M2 and M6 tends to pull second signal output node 2 to ground reducing the node voltage V2 at signal output node 2. In this manner, the single ended receiver, or pseudo differential amplifier circuit 400 operates in a differential amplifier fashion. The single ended current signal which was input from transmission line 770 into signal input 5 is thus converted into a differential current signal in that the source current at source region 725 of transistor M1 tends to decrease and the source current at source region 726 of transistor M2 tends to increase.

However, in this whole process the third transistor M7 and the fourth transistor M8 introduce a controlled hysteresis into the novel pseudo-differential current sense amplifier 700 of FIG. 7A. The fourth transistor M8 serves to retard the increase of a node voltage V1 at the second signal output node 1. In other words, M8 is providing a current path from a second signal output node 1, of the current sense amplifier to ground, wherein providing a path from a second signal output node 1, to ground introduces a hysteresis into the current sense amplifier in order to discriminate against noise transients. The graph of FIG. 7B is used to illustrate this effect. Beginning on the left hand side of the graph in FIG. 7B, the first signal output node 2 is in a high output potential state, shown in FIG. 7B as state 1. At the same time the second signal output node 1 is in a low output potential state. The third transistor M7, a PMOS transistor is "off" and essentially removed from the novel pseudo-differential current sense amplifier circuit 700. With the third transistor M7 turned "off," the third transistor M7 is not providing any input current, IM7, into node 5.

In order for the novel pseudo-differential current sense amplifier circuit 700 to switch the state of an output voltage signal V2 at the first signal output node 2, the current signal, I1, injected into the signal input node 5 must upset, or "trip" the balance of the circuit 700. As an increasing input current signal I1 is injected at node 5, the node voltage V1 of the second signal output node 1 is increasing with current flowing into the source region 725 of the first transistor M1 of the first amplifier 710. The increasing node voltage V1 serves to turn "on" the fourth transistor M8, increasing the conduction between the drain region 736 and the source region 737 of the fourth transistor M8. This action draws current away from node 1 thus retarding the node voltage V1 increase at node 1. This reduced node voltage V1 at node 1 means a larger amount of signal current must be injected into node 5 before the node voltage V1 can shut "off" transistor M4 and the circuit 700 can switch states at the first signal output node 2. Thus the addition of transistor M8 sets a high voltage threshold trip point (Tph) 750 in the novel pseudo differential current sense amplifier circuit 700 for switching from the high output potential, state 1, at first signal output node 1, to a low output potential, state 2. This distinguishes a true "trip" signal from noise transients in the circuit 700.

As shown on the right hand side of graph 7B, the node voltage V2 at the first signal output node 2 is now in a low output potential state, state 2. The second signal output node 1 is in a high potential state. As explained above, the single ended signal input current I1 must upset the balance of the circuit 700 in the opposite direction in order for the circuit 700 to switch states again. In other word, the signal input current must pass a low voltage threshold "trip" point (Tpl). Now that the node voltage V2 at the first signal output node 1 is in a low output potential state, state 2, the third transistor is activated into circuit 700. The low node voltage V2 at the first signal output node 2 is coupled to the gate 730 of transistor M7, turning transistor M7 "on." Turning "on" transistor M7 drives a current, IM7, into the signal input node 5. Thus, M7 is providing a first feedback from a first signal output node 2, of the current sense amplifier to a signal input node 5, wherein providing a first feedback from the first signal output to the signal input node introduces a hysteresis into the current sense amplifier in order to discriminate against noise transients. In other words, the third transistor M7 provides an input current, IM7, into node 5. A single ended input current, I1, injected into input signal node 5 is thus supplemented by the input current IM7. Since the current injected into input signal node 5 is supplemented by input current IM7, the injected current I1 must drop to some lower value for the node voltage, V2, to return to the high output potential, state 1. In other words, because of the supplemented current, IM7, being driven by the third transistor M7, a signal input current I1 will not "trip" the state of the circuit 700 until I1 passes below a certain low current value, i.e. a low voltage threshold trip point (Tpl) 790 as shown in FIG. 7B.

Thus the addition of transistor M7 sets a low voltage threshold trip point (Tpl) 790 in the novel pseudo differential current sense amplifier circuit 700 for switching node voltage V2 from the low output potential, state 2, at first signal output node 1, to a high output potential, state 1. This again distinguishes a true "trip" signal from noise transients in the circuit 700. As one of ordinary skill in the art will understand upon reading this disclosure, the size and doping levels of the third transistor M7 and fourth transistor M8 can be varied to set desired high and low trip points, Tph and Tpl. For example, the size and doping level of the third transistor M7 can be varied to provide a set magnitude of input current, IM7, into node 5. In this manner, the circuit design of circuit 700 can be manipulated to introduce a range of hysteresis for high and low values of single ended signal input currents I1 injected into circuit 700.

Figure 8:
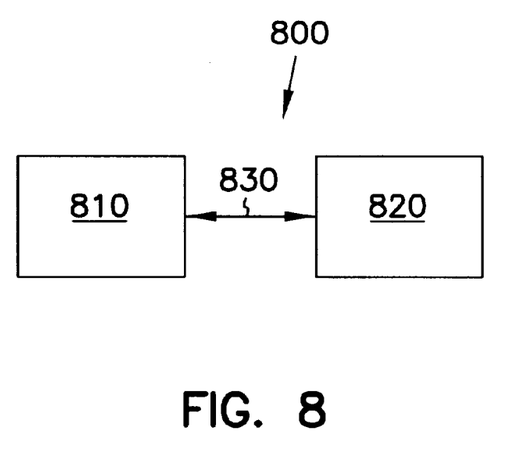
FIG. 8 is a block diagram illustrating an electronic system or integrated circuit according to the teachings of the present invention.

FIG. 8 is a block diagram illustrating an electronic system or integrated circuit according to the teachings of the present invention. As shown in FIG. 8, the electronic system includes a memory 810 and a processor 820 coupled to the memory by a system bus 830. In one embodiment, the processor and memory are located on a single semiconductor chip. The memory 810 includes a novel pseudo-differential current sense amplifier circuit according to the teachings of the present invention and as explained and described in detailed in connection with FIGS. 7A and 7B.

CONCLUSION

Thus, novel structures and methods for improving high speed signaling on and between integrated circuits while improving power requirements has been described. The set hysteresis introduced, by the addition of the third transistor M7 and fourth transistor M8 allows the novel pseudo-differential current sense amplifier circuit to discriminate against small transient noise values which would otherwise cause the circuit 700 to switch states prematurely and provide an inaccurate output node voltage, V2. The introduction of hysteresis into the pseudo-differential current sense amplifier will allow them to discriminate against noise transients since the output will not change states unless the signal input current I1 is increased above a high trip point, Tph, or is reduced below a low trip point, Tpl.

Additionally, the current mirror configuration in the novel pseudo-differential current sense amplifier lowers power constraints and reduces the cost of manufacturing by reducing the amount of hardware required to achieve reliable single-ended signaling. The novel pseudo-differential current sense amplifier circuit produces the same effect that a fully differential signal would have on a conventional differential current sense amplifier as that shown in FIG. 3. Meanwhile, the novel circuit circumvents the necessity having two input transmission lines as in a conventional differential current sense amplifier. The novel pseudo-differential current sense amplifier circuit 700 can latch a voltage output signal on the first signal output node 2 when a single sided current signal of 2.0 mA or less is received at the single signal input node 5. The circuit 700 can latch this voltage output signal to the first signal output node 2 in less than 300 nanoseconds (ns). This is a very rapid response time on par with that provided by conventional differential current sense amplifiers. Further, the novel circuit according to the teachings of the present invention is fully capable of fabrication in a streamlined CMOS process.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the full scope of equivalents to which such claims are entitled.

What is claimed is:

1. A current sense amplifier, comprising:
 a first amplifier and a second amplifier, wherein each amplifier comprises:
  a first transistor of a first conductivity type, wherein the first transistor of a first conductivity type includes an n-channel metal oxide semiconductor (NMOS) transistor; and
  a second transistor of a second conductivity type, wherein the first and second transistors are coupled at a drain region;
 a signal input node coupled to a source region of the first transistor of the first amplifier;
 a first signal output node coupled to the drain region of the first and the second transistor in the second amplifier, and wherein the first signal output node is further coupled to a gate region of a third transistor wherein a source region of the third transistor is coupled to a source region of the second transistor of the first amplifier, and wherein a drain region of the third transistor is coupled to the signal input node; and
 a second signal output node coupled to the drain region of the first and the second transistor in the first amplifier, and wherein the second signal output node is further coupled to a gate region of a fourth transistor.

2. The current sense amplifier of claim 1, wherein the gate region of a first transistor of the first amplifier is coupled to the gate region of the first transistor of the second amplifier and a bias voltage.

3. The current sense amplifier of claim 1, wherein the second transistor of a second conductivity type includes a p-channel metal oxide semiconductor (PMOS) transistor.

4. The current sense amplifier of claim 1, wherein the drain region for the first and the second transistor in the first amplifier are coupled to gates of the second transistor in the first and the second amplifier.

5. The current sense amplifier of claim 1, wherein the third transistor is a p-channel metal oxide semiconductor (PMOS) transistor.

6. The current sense amplifier of claim 1, wherein the fourth transistor is an n-channel metal oxide semiconductor (NMOS) transistor.

7. The current sense amplifier of claim 1, wherein the signal input node of the first amplifier receives an input current, and wherein the signal input node is further coupled to the gate and drain regions of a fifth transistor.

8. The current sense amplifier of claim 7, wherein the source of the first transistor of the second amplifier is coupled to the drain region of a sixth transistor.

9. A current sense amplifier, comprising:
a first amplifier and a second amplifier, wherein each amplifier comprises:
a first transistor of a first conductivity type, wherein the first transistor of a first conductivity type includes an n-channel metal oxide semiconductor (NMOS) transistor; and
a second transistor of a second conductivity type, wherein the first and second transistors are coupled at a drain region;
a signal input node coupled to a source region of the first transistor of the first amplifier, wherein the signal input node receives an input current;
a first signal output node coupled to the drain region of the first and the second transistor in the second amplifier, and wherein the first signal output node is further coupled to a gate region of a third transistor wherein the third transistor is a p-channel metal oxide semiconductor (PMOS) transistor;
a second signal output node coupled to the drain region of the first and the second transistor in the first amplifier, and wherein the second signal output node is further coupled to a gate region of a fourth transistor; and
a current mirror, wherein the current mirror is coupled to the signal input node and the source region of the first transistor of the second amplifier.

10. The current sense amplifier of claim 9, wherein a fifth transistor, of the current mirror, is coupled by its drain region to the source of the first transistor of the first amplifier.

11. The current sense amplifier of claim 10, wherein a sixth transistor, of the current mirror, is coupled by its drain region to the source region of the first transistor of the second amplifier.

12. The current sense amplifier of claim 11, wherein the gate region of the sixth transistor is coupled to the gate region of the fifth transistor.

13. The current sense amplifier of claim 12, wherein the gate region of the sixth transistor is further coupled to the drain region Of the fifth transistor.

14. The current sense amplifier of claim 9, wherein the gate region of a first transistor of the first amplifier is coupled to the gate region of the first transistor of the second amplifier and a bias voltage.

15. The current sense amplifier of claim 9, wherein a source region of the third transistor is coupled to a source region of the second transistor of the first amplifier, and wherein a drain region of the third transistor is coupled to the signal input node.

16. The current sense amplifier of claim 9, wherein the second transistor of a second conductivity type includes a p-channel metal oxide semiconductor (PMOS) transistor.

17. The current sense amplifier of claim 9, wherein the drain region for the first and the second transistor in the first amplifier are coupled to gates of the second transistor in the first and the second amplifier.

18. The current sense amplifier of claim 9, wherein the fourth transistor is an n-channel metal oxide semiconductor (NMOS) transistor.

19. The current sense amplifier of claim 11, wherein the source region of the fifth and sixth transistors are coupled to ground.

20. The current sense amplifier of claim 11, wherein the fifth and sixth transistors are n-channel metal oxide semiconductor (NMOS) transistors.

21. A current sense amplifier, comprising:
a first amplifier and a second amplifier, wherein each amplifier comprises:
a first transistor of a first conductivity type, wherein the first transistor of a first conductivity type includes an n-channel metal oxide semiconductor (NMOS) transistor; and
a second transistor of a second conductivity type, wherein the first and second transistors are coupled at a drain region;
a signal input node coupled to a source region of the first transistor of the first amplifier;
a first signal output node coupled to the drain region of the first and the second transistor in the second amplifier, and wherein the first signal output node is further coupled to a gate region of a third transistor wherein a source region of the third transistor is coupled to a source region of the second transistor of the first amplifier, and wherein a drain region of the third transistor is coupled to the signal input node;
a second signal output node coupled to the drain region of the first and the second transistor in the first amplifier, and wherein the second signal output node is further coupled to a gate region of a fourth transistor; and
a current mirror, wherein the current mirror is coupled to the signal input node and the source region of the first transistor of the second amplifier, comprising:
a fifth transistor, of the current mirror, coupled by its drain region to the source region of the first transistor of the first amplifier; and
a sixth transistor, of the current mirror, coupled by its drain region to the source region of the first transistor of the second amplifier, wherein the gate region of the sixth transistor is coupled to the gate region of the fifth transistor.

22. The current sense amplifier of claim 21, wherein the gate region of a first transistor of the first amplifier is coupled to the gate region of the first transistor of the second amplifier and a bias voltage.

23. The current sense amplifier of claim 21, wherein the second transistor of a second conductivity type includes a p-channel metal oxide semiconductor (PMOS) transistor.

24. The current sense amplifier of claim 21, wherein the drain region for the first and the second transistor in the first amplifier are coupled to gates of the second transistor in the first and the second amplifier.

25. The current sense amplifier of claim 21, wherein the third transistor is a p-channel metal oxide semiconductor (PMOS) transistor.

26. The current sense amplifier of claim 21, wherein the fourth transistor is an n-channel metal oxide semiconductor (NMOS) transistor.

27. The current sense amplifier of claim 21, wherein the signal input node of the first amplifier receives an input current, and wherein the signal input node is further coupled to the gate and drain regions of a fifth transistor.

28. The current sense amplifier of claim 21, wherein the source of the first transistor of the second amplifier is coupled to the drain region of a sixth transistor.

29. The current sense amplifier of claim 21, wherein the current mirror is coupled to ground.

30. The current sense amplifier of claim 21, wherein the fifth and the sixth transistors are n-channel metal oxide semiconductors (NMOS) transistors.

31. An electronic system, comprising:
 a processor;
 a memory device; and
 a bus coupling the processor and the memory device, the memory device including a current sense amplifier, comprising:
  a first amplifier and a second amplifier, wherein each amplifier comprises:
   a first transistor of a first conductivity type, wherein the first transistor of a first conductivity type includes an n-channel metal oxide semiconductor (NMOS) transistor; and
   a second transistor of a second conductivity type, wherein the first and second transistors are coupled at a drain region;
  a signal input node coupled to a source region of the first transistor of the first amplifier;
  a first signal output node coupled to the drain region of the first and the second transistor in the second amplifier, and wherein the first signal output node is further coupled to a gate of a third transistor, wherein the third transistor includes a p-channel metal oxide semiconductor (PMOS) transistor; and
  a second signal output node coupled to the drain region of the first and the second transistor in the first amplifier, and wherein the second signal output node is further coupled to a gate of a fourth transistor, wherein the fourth transistor includes an n-channel metal oxide semiconductor (NMOS) transistor.

32. The electronic system of claim 31, wherein the gate of a first transistor of the first amplifier is coupled to the gate of the first transistor of the second amplifier and a bias voltage.

33. The electronic system of claim 31, wherein a source region of the third transistor is coupled to a source region of the second transistor of the first amplifier, and wherein a drain region of the third transistor is coupled to the signal input node.

34. The electronic system of claim 31, wherein the drain region for the first and the second transistor in the first amplifier are coupled to gates of the second transistor in the first and the second amplifier.

35. The electronic system of claim 31, wherein the signal input node of the first amplifier receives an input current, and wherein the signal input node is coupled to the gate and drain of a fifth transistor.

36. The electronic system of claim 35, wherein the source of the first transistor of the second amplifier is coupled to the drain of a sixth transistor.

37. An integrated circuit, comprising:
 a processor;
 a memory operatively coupled to the processor; and
 wherein the processor and memory are formed on the same semiconductor substrate and the memory includes at least one current sense amplifier, comprising:
  a first amplifier and a second amplifier, wherein each amplifier comprises:
   a first transistor of a first conductivity type, wherein the first transistor of a first conductivity type includes an n-channel metal oxide semiconductor (NMOS) transistor; and
   a second transistor of a second conductivity type, wherein the first and second transistors are coupled at a drain region;
  a signal input node coupled to a source region of the first transistor of the first amplifier;
  a first signal output node coupled to the drain region of the first and the second transistor in the second amplifier, and wherein the first signal output node is further coupled to a gate of a third transistor, wherein the third transistor includes a p-channel metal oxide semiconductor (PMOS) transistor; and
  a second signal output node coupled to the drain region of the first and the second transistor in the first amplifier, and wherein the second signal output node is further coupled to a gate of a fourth transistor, wherein the fourth transistor includes an n-channel metal oxide semiconductor (NMOS) transistor.

38. The integrated circuit of claim 37, wherein the gate of a first transistor of the first amplifier is coupled to the gate of the first transistor of the second amplifier and a bias voltage.

39. The integrated circuit of claim 37, wherein a source region of the third transistor is coupled to a source region of the second transistor of the first amplifier, and wherein a drain region of the third transistor is coupled to the signal input node.

40. The integrated circuit of claim 37, wherein the drain region for the first and the second transistor in the first amplifier are coupled to gates of the second transistor in the first and the second amplifier.

41. The integrated circuit of claim 37, wherein the signal input node of the first amplifier receives an input current, and wherein the signal input node is coupled to the gate and drain of a fifth transistor.

42. The integrated circuit of claim 41, wherein the source region of the first transistor of the second amplifier is coupled to the drain of a sixth transistor.

43. A method of forming a current sense amplifier, comprising:
 forming a first amplifier and a second amplifier, wherein forming each amplifier comprises:
  forming a first transistor of a first conductivity type, wherein forming the first transistor of the first conductivity type includes forming an n-channel metal oxide semiconductor (NMOS) transistor;
  forming a second transistor of a second conductivity type, wherein the first and second transistors are coupled at a drain region; and
 forming a signal input node coupled to a source region of the first transistor of the first amplifier;
 forming a first signal output node coupled to the drain region of the first and the second transistor in the second amplifier, and wherein forming the first signal output node includes coupling the first signal output node to a gate region of a third transistor wherein coupling the first signal output node to a gate of a third transistor includes coupling a source region of the third transistor to a source region of the second transistor of the first amplifier, and coupling a drain region of the third transistor to the signal input node; and forming a second signal output node coupled to the drain region of the first and the second transistor in the first amplifier, and wherein the second signal output node is further coupled to a gate region of a fourth transistor.

44. The method of claim 43, wherein the method further includes coupling the gate region of a first transistor of the first amplifier to the gate region of the first transistor of the second amplifier and coupling the gate regions of the first transistors in the first and the second amplifiers to a bias voltage.

45. The method of claim 43, wherein forming the second transistor of a second conductivity type and the third transistor includes forming a p-channel metal oxide semiconductor (PMOS) transistor.

46. The method of claim 43, wherein forming the first amplifier and the second amplifier includes coupling the drain region for the first and the second transistor in the first amplifier to gates of the second transistor in the first and the second amplifier.

47. A method for operating a current sense amplifier, comprising:

providing a current signal to a signal input node of the current sense amplifier;

providing a voltage to a gate of a first transistor in each of a first and a second amplifier;

providing a first feedback from a first signal output of the current sense amplifier to a signal input node, wherein providing a first feedback from a first signal output to the signal input node introduces a hysteresis into the current sense amplifier in order to discriminate against noise transients in the current sense amplifier; and providing a path from a second signal output of the current sense amplifier to ground, wherein providing a path from a second signal output to ground introduces a hysteresis into the current sense amplifier in order to discriminate against noise transients in the current sense amplifier.

48. The method of claim 47, wherein providing a first feedback from the first signal output to the signal input node includes adjusting a low threshold voltage trip point (Tpl) in the current sense amplifier.

49. The method of claim 47, wherein providing a path from a second signal output to ground includes adjusting a high threshold voltage trip point (Tph) in the current sense amplifier.

* * * * *